(12) United States Patent
Chong et al.

(10) Patent No.: US 12,080,625 B2
(45) Date of Patent: Sep. 3, 2024

(54) SEMICONDUCTOR PACKAGE WITH RELEASABLE ISOLATION LAYER PROTECTION

(71) Applicant: Infineon Technologies Austria AG, Villach (AT)

(72) Inventors: Li Fong Chong, Melaka (MY); Yee Beng Daryl Yeow, Melaka (MY); Chii Shang Hong, Melaka (MY); Azlina Kassim, Melaka (MY); Hui Kin Lit, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/235,668

(22) Filed: Aug. 18, 2023

(65) Prior Publication Data
US 2023/0395462 A1 Dec. 7, 2023

Related U.S. Application Data

(62) Division of application No. 17/355,342, filed on Jun. 23, 2021, now Pat. No. 11,791,238.

(51) Int. Cl.
*H01L 23/495* (2006.01)
*H01L 21/56* (2006.01)
(Continued)

(52) U.S. Cl.
CPC ........ *H01L 23/4334* (2013.01); *H01L 21/561* (2013.01); *H01L 21/565* (2013.01);
(Continued)

(58) Field of Classification Search
CPC . H01L 23/562; H01L 23/4334; H01L 23/315; H01L 23/49558
(Continued)

(56) References Cited

U.S. PATENT DOCUMENTS 6,143,076 A 11/2000 Rasmussen et al.
8,049,312 B2 * 11/2011 Herbsommer .......... H01L 24/41
257/713
(Continued)

FOREIGN PATENT DOCUMENTS

CN 2778815 Y 5/2006
CN 104789150 A 7/2015
(Continued)

OTHER PUBLICATIONS

Kasztelan, Christian, et al., "Protector Cap for Package with Thermal Interface Material", U.S. Appl. No. 17/175,967, filed Feb. 15, 2021, 1-58.

*Primary Examiner* — Nitin Parekh
(74) *Attorney, Agent, or Firm* — Murphy, Bilak & Homiller, PLLC

(57) ABSTRACT

A semiconductor device includes a semiconductor package, including a package body that includes an encapsulant portion and an isolation structure, a semiconductor die embedded within the package body, and a plurality of leads that protrude out from the encapsulant body, wherein the encapsulant portion and the isolation structure are each electrically insulating structures, wherein the isolation structure has a greater thermal conductivity than the encapsulant portion, and wherein the isolation structure is thermally coupled to the semiconductor die, and a releasable layer affixed to the semiconductor package, wherein a first outer face of the package body includes a first surface of the isolation structure, wherein the releasable layer at least partially covers the first surface of the isolation structure, and wherein the releasable layer is releasable from the semiconductor package.

11 Claims, 8 Drawing Sheets

(51) Int. Cl.
*H01L 23/00* (2006.01)
*H01L 23/31* (2006.01)
*H01L 23/433* (2006.01)

(52) U.S. Cl.
CPC ...... *H01L 23/315* (2013.01); *H01L 23/49503* (2013.01); *H01L 23/562* (2013.01); *H01L 24/32* (2013.01); *H01L 24/48* (2013.01); *H01L 2224/32245* (2013.01); *H01L 2224/48245* (2013.01)

(58) Field of Classification Search
USPC ....................................................... 257/666
See application file for complete search history.

(56) References Cited

U.S. PATENT DOCUMENTS

| | | | |
|---|---|---|---|
| 8,198,139 B2* | 6/2012 | Yang | H01L 23/49575 438/123 |
| 8,304,903 B2* | 11/2012 | Herbsommer | H01L 24/38 257/E23.07 |
| 8,921,999 B2* | 12/2014 | Kimura | H01L 21/4853 257/713 |
| 9,064,859 B2 | 6/2015 | Chi et al. | |
| 9,070,659 B2* | 6/2015 | Yasunaga | H01L 23/49513 |
| 9,093,434 B2 | 7/2015 | Kimura et al. | |
| 9,484,336 B2 | 11/2016 | Kimura | |
| 2001/0052639 A1 | 12/2001 | Jeon et al. | |
| 2012/0236503 A1 | 9/2012 | Asada et al. | |
| 2015/0102479 A1 | 4/2015 | Fuergut et al. | |
| 2015/0279717 A1 | 10/2015 | Taniguchi et al. | |
| 2017/0098598 A1 | 4/2017 | Otremba et al. | |
| 2017/0117208 A1 | 4/2017 | Kasztelan et al. | |
| 2017/0160828 A1 | 6/2017 | Leonhard et al. | |
| 2018/0342438 A1* | 11/2018 | Chen | H01L 23/49568 |
| 2020/0294885 A1 | 9/2020 | Fuergut et al. | |
| 2020/0357729 A1* | 11/2020 | Kim | H01L 24/83 |
| 2021/0202357 A1* | 7/2021 | Poddar | H01L 23/49503 |
| 2022/0386448 A1 | 12/2022 | Milyavsky | |

FOREIGN PATENT DOCUMENTS

| | | |
|---|---|---|
| EP | 2574218 B1 | 4/2016 |
| EP | 3872851 A1 | 9/2021 |
| JP | 2002084083 A | 3/2002 |
| JP | 2005353805 A | 12/2005 |

\* cited by examiner

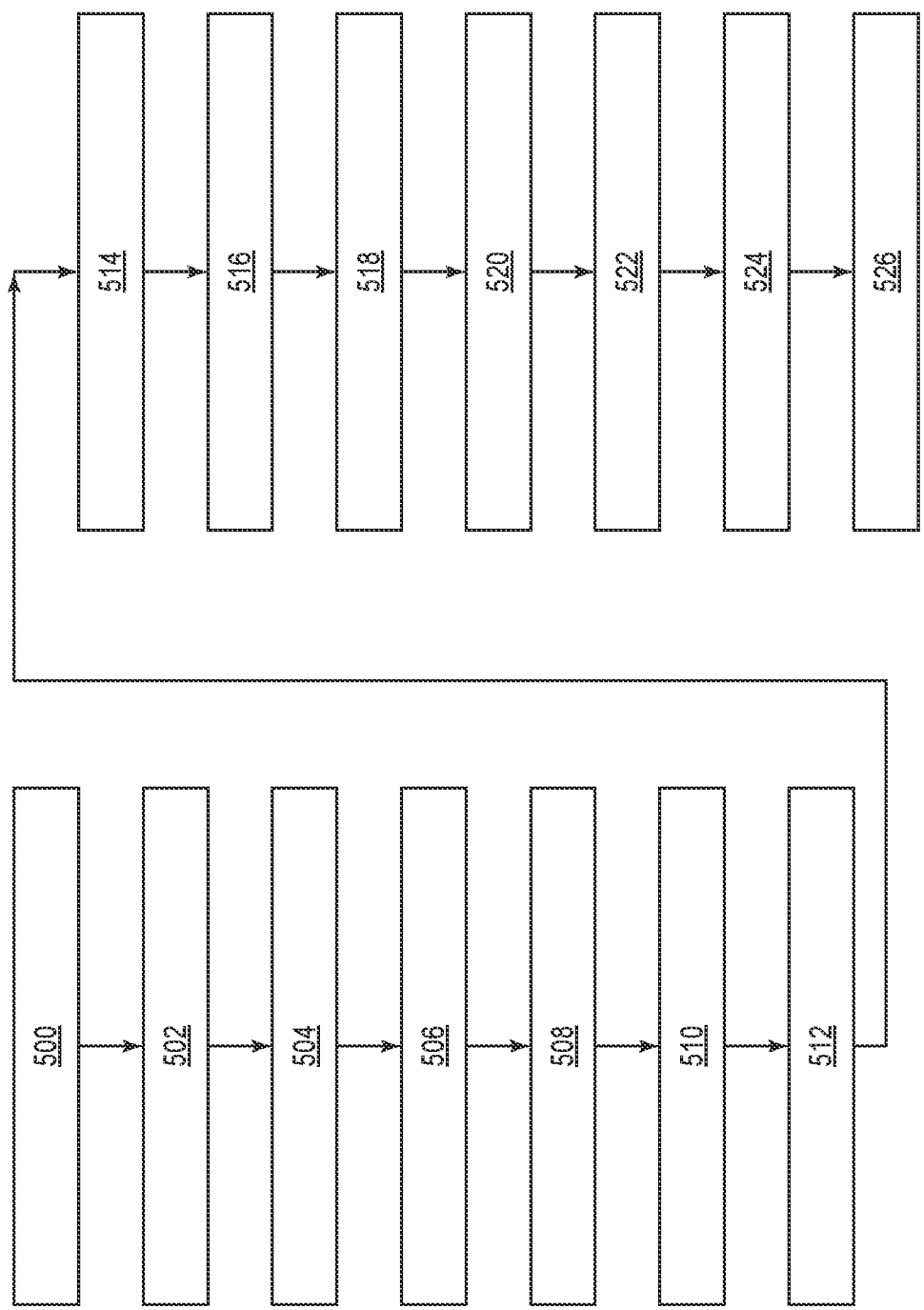

SEMICONDUCTOR PACKAGE WITH RELEASABLE ISOLATION LAYER PROTECTION

TECHNICAL FIELD

The instant application relates to semiconductor packaging, and more particularly to semiconductor packages with advanced isolation materials.

BACKGROUND

Discrete high-voltage semiconductor devices such as MOSFETs (metal oxide semiconductor field effect transistors), IGBTs (insulated gate bipolar transistors), diodes, etc., are commonly packaged in a molded semiconductor package that includes several leads protruding out an encapsulant body. These types of semiconductor packages are commonly used in high power applications such as automotive, power transmission, HVAC, etc. An important performance consideration in semiconductor packages is heat dissipation. As power semiconductor devices typically generate a substantial amount of heat during operation, package designers seek to improve the thermal dissipation characteristics of the semiconductor package, as it can lead to a favorable improvement in performance. Typical molding materials used to form the package encapsulant body offer excellent electrical insulation properties, but are poor thermal insulators. There is a need to improve the thermal dissipation capability of semiconductor packages without sacrificing electrical performance.

SUMMARY

A semiconductor device is disclosed. According to an embodiment, the semiconductor device comprises a semiconductor package, comprising a package body that comprises an encapsulant portion and an isolation structure, a semiconductor die embedded within the package body, and a plurality of leads that protrude out from the encapsulant body, wherein the encapsulant portion and the isolation structure are each electrically insulating structures, wherein the isolation structure has a greater thermal conductivity than the encapsulant portion, and wherein the isolation structure is thermally coupled to the semiconductor die, and a releasable layer affixed to the semiconductor package, wherein a first outer face of the package body comprises a first surface of the isolation structure, wherein the releasable layer at least partially covers the first surface of the isolation structure, and wherein the releasable layer is releasable from the semiconductor package.

Separately or in combination, the encapsulant portion has a greater hardness than the isolation structure.

Separately or in combination, the encapsulant portion comprises a mold compound, and the isolation structure comprises thermal interface material.

Separately or in combination, the releasable layer completely covers and is releasable from the first surface of the isolation structure.

Separately or in combination, the first outer face of the package body further comprises a first surface of the encapsulant portion that surrounds the isolation structure, and the releasable layer at least partially covers and is releasable from the first surface of the encapsulant portion.

Separately or in combination, the semiconductor package further comprises an opening in the package body that extends through the isolation structure and the encapsulant portion, and the releasable layer extends over the opening.

Separately or in combination, the releasable layer is an adhesive tape that is adhered to and releasable from the first surface of the isolation structure.

Separately or in combination, the releasable layer comprises a main portion and a tab, wherein the main portion is adhered to and releasable from the first surface of the isolation structure, and wherein the tab is connected to the main portion and is decoupled from the package body.

Separately or in combination, the tab extends away from the package body in an opposite direction as the leads.

Separately or in combination, the tab extends away from the package body in the same direction as the leads.

Separately or in combination, the semiconductor package further comprises a die pad, wherein the semiconductor die is mounted on the die pad, and wherein the isolation structure is thermally coupled to the semiconductor die via the die pad.

A method of producing a semiconductor device is disclosed. According to an embodiment the method comprises: providing a semiconductor package, the semiconductor package comprising a package body that comprises an encapsulant portion and an isolation structure, a semiconductor die embedded within the package body, and a plurality of leads that protrude out from the encapsulant body, wherein the isolation structure has a greater thermal conductivity than the encapsulant portion, wherein the isolation structure is thermally coupled to the semiconductor die, and wherein a first outer face of the package body comprises a first surface of the isolation structure, applying a releasable layer to the first outer face of the package body such that the releasable layer at least partially covers the first surface of the isolation structure, wherein the releasable layer is configured to substantially protect the isolation structure from damage during transport and assembly, and wherein the releasable layer is releasable from the package body by mechanical force.

Separately or in combination, the encapsulant portion comprises a mold compound, and wherein the isolation structure comprises thermal interface material.

Separately or in combination, providing the semiconductor package comprises providing a lead frame strip that comprises a plurality of unit lead frames, each of the unit lead frames comprising a die pad and a plurality of leads that are each connected to a peripheral structure of the lead frame strip, attaching one of the semiconductor dies on each of the unit lead frames, and forming the package body on each of the each of the unit lead frames, and wherein applying the releasable layer comprises attaching a continuous layer of releasable material to each package body on the lead frame strip.

Separately or in combination, the method further comprises cutting the continuous layer to form separated ones of the releasable layers for each package body on the lead frame strip, and separating the unit lead frames from the peripheral structure of the lead frame strip after cutting the continuous layer.

Separately or in combination, forming the package body comprises a molding process, wherein the method further comprises performing a deflashing step after the molding process that removes excess mold material from the package body, and performing a plating process that forms a metal plating on the leads, and the applying of the releasable layer comprises attaching the continuous layer in between the deflashing step and the plating process.

Separately or in combination, the releasable layer comprises an adhesive tape, and wherein applying the releasable layer comprises attaching the adhesive tape to the first surface of the isolation structure after forming the package body.

Separately or in combination, the releasable layer comprises a non-adhesive film, and wherein applying the releasable layer comprises applying an adhesive to the first surface of the isolation structure after forming the package body and attaching the non-adhesive film to the adhesive.

Separately or in combination, the releasable layer comprises a main portion and a tab, and wherein the releasable layer is applied to the first outer face of the package body such that body such that the tab extends away from the package body in an opposite direction as the leads.

Separately or in combination, the releasable layer comprises a main portion and a tab, and wherein the releasable layer is applied to the first outer face of the package body such that that the tab extends away from the package body in the same direction as the leads.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B, illustrates a semiconductor package, according to an embodiment. FIG. 1A depicts a first outer face of the semiconductor package that comprises an isolation structure, and FIG. 1B depicts a second outer face of the semiconductor package that comprises encapsulant material.

FIG. 8 depicts a process flow that includes selected processing steps for producing a semiconductor device that comprises a semiconductor package and a releasable layer.

DETAILED DESCRIPTION

Disclosed herein is a semiconductor package with an advanced isolation structure and a releasable layer that advantageously protects the advanced isolation structure. The semiconductor package comprises an encapsulant material that in combination with the advanced isolation structure forms an electrically insulating package body that encapsulates a semiconductor die. The advanced isolation structure has a higher thermal conductivity than the encapsulant material. For example, the advanced isolation structure may comprise a thermal interface material (TIM) whereas the encapsulant material comprises mold compound. The advanced isolation structure is thermally coupled to the semiconductor die, thus providing a thermally efficient mechanism for extracting heat away from the semiconductor die. The material properties of the advanced isolation structure, while advantageous for thermal coupling, make it susceptible to damage such as scratching. The releasable layer is an advantageous temporary structure that protects the advanced isolation structure from damage. Moreover, the releasable layer can be easily removed by simple mechanical force before the semiconductor package is mounted.

Figure 1:
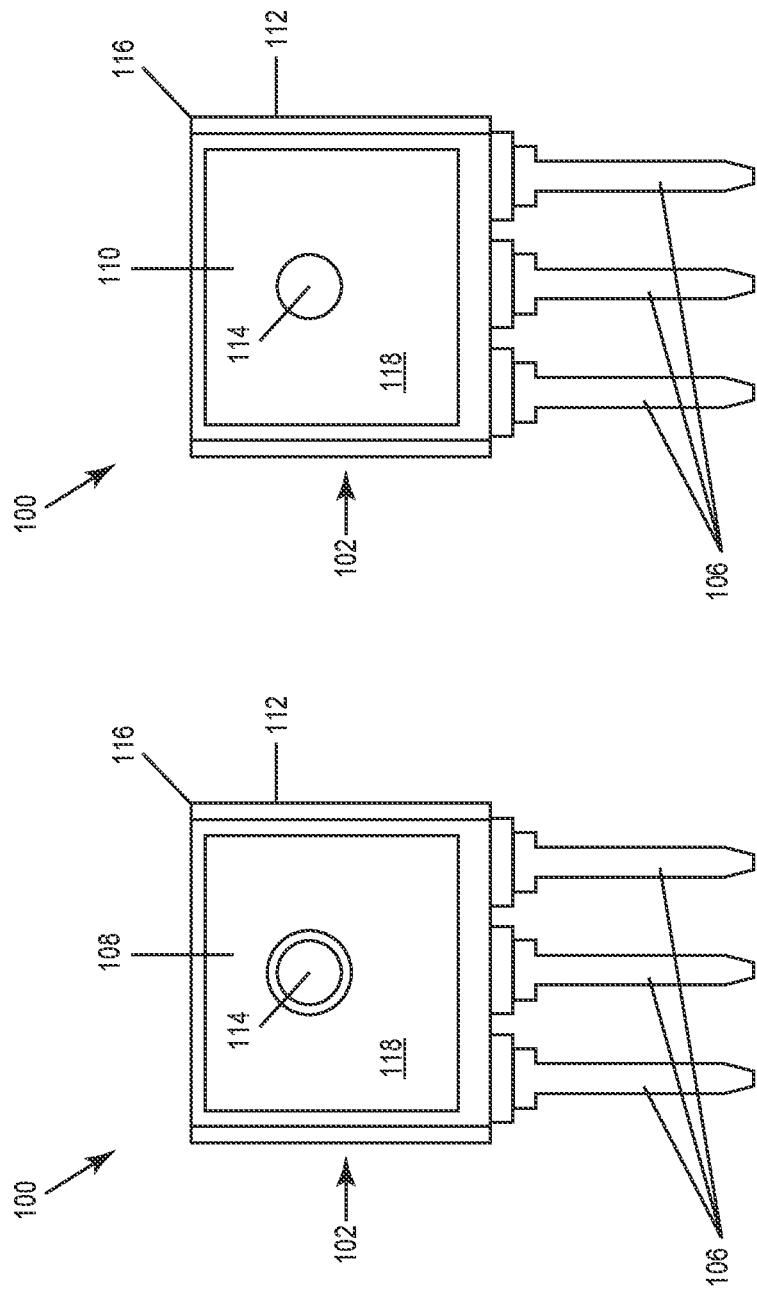
FIG. 1, which includes

Referring to FIG. 1, a semiconductor package 100 is depicted, according to an embodiment. The semiconductor package 100 comprises a package body 102. The package body 102 is an electrically insulating structure that encapsulates and electrically isolates a semiconductor die 104 (shown in FIG. 2). The semiconductor package 100 comprises a plurality of leads 106 that protrude out from the package body 102. The package leads 106 are electrically conductive structures that are configured to be inserted into a circuit carrier, such as a PCB. As shown, the semiconductor package 100 comprises three of the package leads 106. More generally, the semiconductor package 100 may comprise different numbers of the package leads 106, e.g., two, three, four, etc.

The package body 102 comprises a first outer face 108, a second outer face 110, and outer edge sides 112 extending between the first and second outer faces 108, 110. The first and second outer faces 108, 110 may be the largest (area wise) surfaces of the package body 102. According to an embodiment, the semiconductor package 100 comprises an opening 114 that extends between the first and second outer faces 108, 110. The opening 114 may be dimensioned to receive a fastener 122, e.g., in the manner depicted in FIG. 2.

According to an embodiment, the semiconductor package 100 is configured as a discrete power device. A discrete power device refers to a single packaged device that is configured to block high voltages and and/or to conduct high currents as between two load terminals. Generally speaking, a discrete power device may be rated to block voltages of at least 100V, and more commonly on the order of 250V, 500V, 600V, 1,200V, 2,000V and/or may be rated to conduct currents of 10 A, 50 A, 100 A, 500 A or more. A discrete power device may comprise one or more semiconductor dies 104 connected between the two load terminals of the semiconductor package 100. These semiconductor dies 104 may be configured as a discrete diode die, a discrete MOSFET (Metal Oxide Semiconductor Field Effect Transistor) die, a discrete IGBT (Insulated Gate Bipolar Transistor) die, a discrete HEMT (High Electron Mobility Transistors) die, a discrete JFET (Junction Field Effect Transistors) die, etc. These semiconductor dies 104 may be rated to block voltages of at least 100V, and more commonly on the order of 250V, 500V, 600V, 1,200V, 2,000V and/or may be rated to conduct currents of 10 A, 50 A, 100 A, 500 A or more.

In a particular embodiment of a discrete power device, the semiconductor package 100 may be configured as a discrete transistor package. For example, the semiconductor package 100 may be configured as a discrete IGBT, a discrete MOSFET, a discrete HEMT, etc. In these package types, the package leads 106 may correspond to the gate, source and drain terminals in the case of a MOSFET, the gate, emitter and collector terminals in the case of an IGBT, etc. A discrete transistor package may comprise a single transistor die or multiple transistor dies connected in parallel with one another so as to provide the equivalent functionality of a single transistor. Additionally or alternatively, a discrete transistor package may comprise a fourth lead that is configured as a sense terminal, (e.g., source-sense, drain-sense, etc.).

The package body 102 comprises an encapsulant portion 116. The encapsulant portion 116 is formed from a rigid and electrically insulating material that provides high voltage isolation. Examples of these materials include mold compound, thermosetting plastic, epoxy, resins, and laminate materials. The encapsulant portion 116 can be formed by a molding process such as injection molding, compression molding, transfer molding, etc. Alternatively, the encapsulant portion 116 can be a laminate structure that is formed by successively stacking layers of laminate material on top of one another.

The package body 102 additionally comprises an isolation structure 118. The isolation structure 118 is an electrically insulating structure with higher thermal conductivity than the encapsulant portion 116. For example, the isolation structure 118 may have a thermal conductivity on the order of at least 1 W/mK (Watt per Meter-Kelvin), at least 2 W/mK, at least 3 W/mK, or at least 5 W/m, whereas the encapsulant portion 116 may have a thermal conductivity of no greater than 1 W/mK, or no greater than 0.1 W/mK. The isolation structure 118 may comprise a thermal interface material (TIM), a thermal grease, or a phase change material. Examples of various configurations for the isolation structured 118 and/or materials for the isolation structure 118 are described in in U.S. application Ser. No. 14/501,070 filed on Sep. 30, 2014, U.S. application Ser. No. 15/333,993 filed on Oct. 25, 2016, and U.S. application Ser. No. 16/816,561 filed on Mar. 12, 2020, the content of each document being incorporated by reference in its entirety. In an embodiment, the isolation structure 118 comprises a silicone matrix and thermally conductive and electrically insulating filler particles suspended in the material. These filler particles may be a metal oxide and/or metal nitride, in particular at least one of $SiO_2$, $Al_2O_3$, AlN, $ZrO_2$, $Si_3N_4$, BN, diamond, etc.

The first outer face 108 of the package body 102 comprises a first surface of the isolation structure 118. That is, the isolation structure 118 forms at least part of the first outer face 108 of the package body 102. The first surface of the isolation structure 118 may be coplanar with a surface of the encapsulant portion 116 at the first outer face 108. For example, the isolation structure 118 can be disposed within a recess formed within the encapsulant portion 116 such that the encapsulant portion 116 forms a ring that surrounds the isolation structure 118. More generally, the shape and arrangement of the isolation structure 118 may vary. For example, the isolation structure 118 may form a complete outer face of the package body 102 and/or may be exposed at multiple faces of the package body 102.

Figure 2:
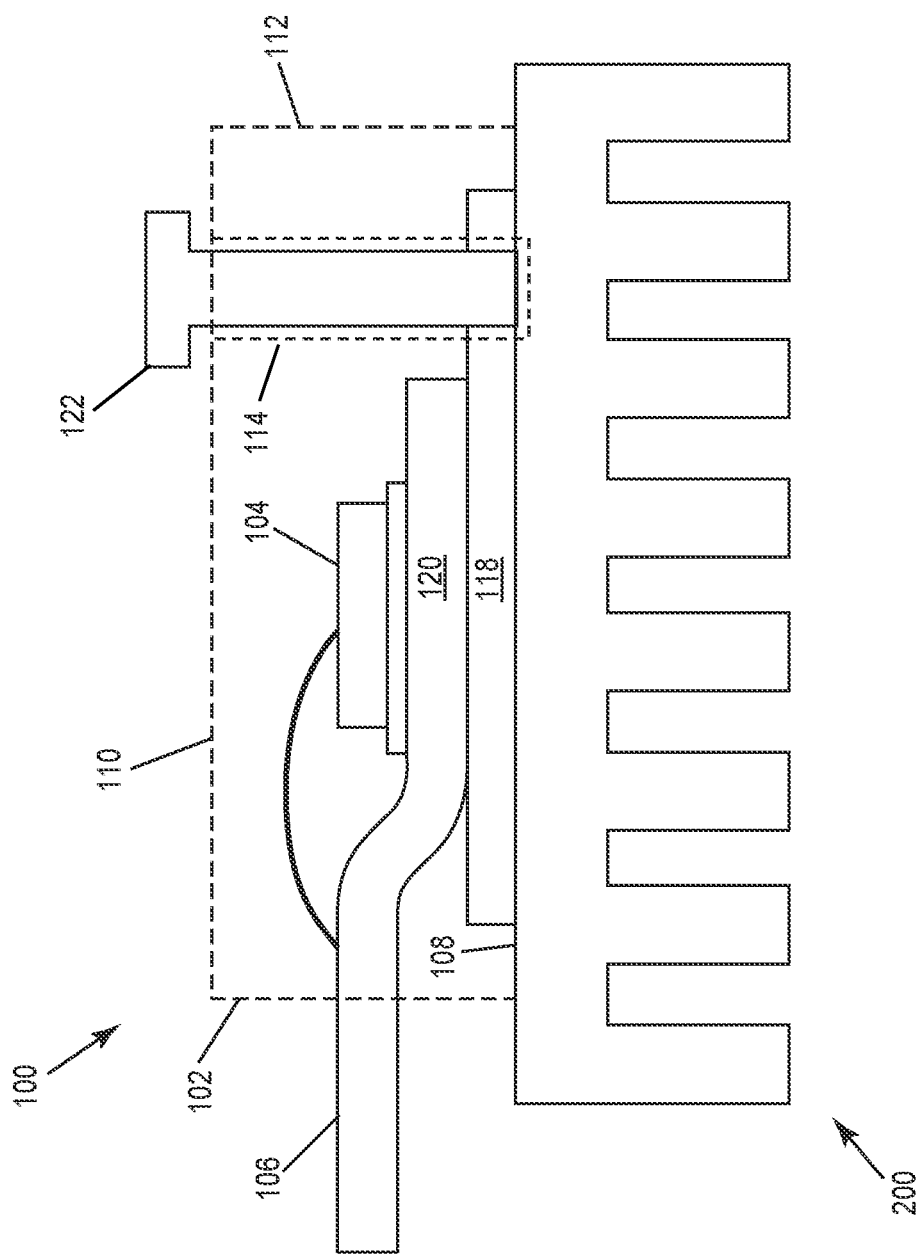
FIG. 2 depicts an assembly that comprises a semiconductor package mounted on a heat sink, according to an embodiment.

Referring to FIG. 2, an assembly that comprises the semiconductor package 100 and a heat sink 200 is shown. The semiconductor package 100 is mounted on the heat sink 200 with the first outer face 108 of the package body 102 flush against the heat sink 200. The semiconductor package 100 comprises a die pad 120 and a semiconductor die 104 that is mounted on the die pad 120. The die pad 120 and the leads 106 may be collectively provided from a lead frame formed of metal, such as copper (Cu), aluminum (Al), nickel (Ni), silver (Ag), palladium (Pd), gold (Au), etc., alloys or combinations thereof. A terminal of the semiconductor die 104 (e.g., a drain, collector, etc.) is electrically connected to one of the leads 106 via the die pad 120 and additional terminals of the semiconductor die 104 (e.g. source, emitter, gate, etc.) are electrically connected to the leads 106 by bond wires. More generally, any of a variety of interconnect elements such as ribbons, clips, etc. may be used to complete the electrical connections between the semiconductor die 104 and the leads 106.

The semiconductor package 100 is mounted to the heat sink 200 such that the die pad 120 and the isolation structure 118 provide a thermally conductive path that transfers heat between the semiconductor die 104 and the heat sink 200. The isolation structure 118 is thermally coupled to the semiconductor die 104 via the die pad 120, which in turn is thermally coupled to the semiconductor die 104. This thermal conduction path may also comprise adhesives and intermediary materials, e.g., solder, conductive glue, etc. The high thermal conductivity of the isolation structure 118 allows for efficient heat transfer between the semiconductor die 104 and the heat sink 200. Moreover, the electrically insulating properties of the isolation structure 118 mean that the semiconductor die 104 is electrically isolated from the heat sink 200, which allows for high voltage operation of the semiconductor die 104. The semiconductor package 100 may be mounted by a fastener 122, e.g., screw, pin, bolt, etc. The fastener 122 may extend completely through the opening 114 and be received by the heat sink 200. Additionally or alternatively, the fastener 122 and the opening 114 may be may be used in combination with an external clip to secure the semiconductor package 100 to the heat sink 200.

The isolation structure 118 may be a relatively soft structure. For example, the isolation structure 118 may have a compressibility in a range between 1% and 40% (which may be measured by applying a 1 N force at a layer of the interface structure having a thickness of 250 µm using a Vickers-micro-indenter), in particular in a range between 25% and 35%. When the isolation structure 118 is brought in contact with the heat sink 200, the soft material properties of the isolation structure 118 ensure a proper full-surface contact and thus an efficient heat transfer from the isolation structure 118 to heat sink 200. In particular, it may be sufficient to directly connect the isolation structure 118 with the heat sink 200 using the fastener 122, and in particular without the need of thermal grease in between the thermal interface structure and the heat sink 200. By contrast, the encapsulant portion 116 has a greater hardness than the isolation structure 118. For example, an encapsulant portion 116 formed from any of the above-listed materials (e.g., mold compound, thermosetting plastic, epoxy, resins, laminate materials, etc.) may have a compressibility of less than 5%, and more commonly less than 1%, less than 0.5%, or less than 0.1% on the same measurement under the using a Vickers-micro-indenter. This difference in hardness is attributable to the different material composition of the isolation structure 118 and the encapsulant portion 116.

The mechanical properties of the isolation structure 118 are such that the semiconductor package 100 is susceptible to damage, particularly in the time between the manufacture of the semiconductor package 100 and when the semiconductor package 100 is mounted in an assembly (e.g., as shown in FIG. 2). At this time, the semiconductor package 100 may be tested and handled by testing equipment, packaged for shipping, transported from a manufacturer to a customer, removed from the shipping packaging, and mounted on a customer apparatus such as a heat sink and/or circuit board. A mechanical stimulus applied by humans and/or machines during any of these steps may form scratches, cracks and other imperfections may arise in the isolation structure 118. This damage may degrade performance and/or render the semiconductor package 100 dysfunctional.

Figure 3:
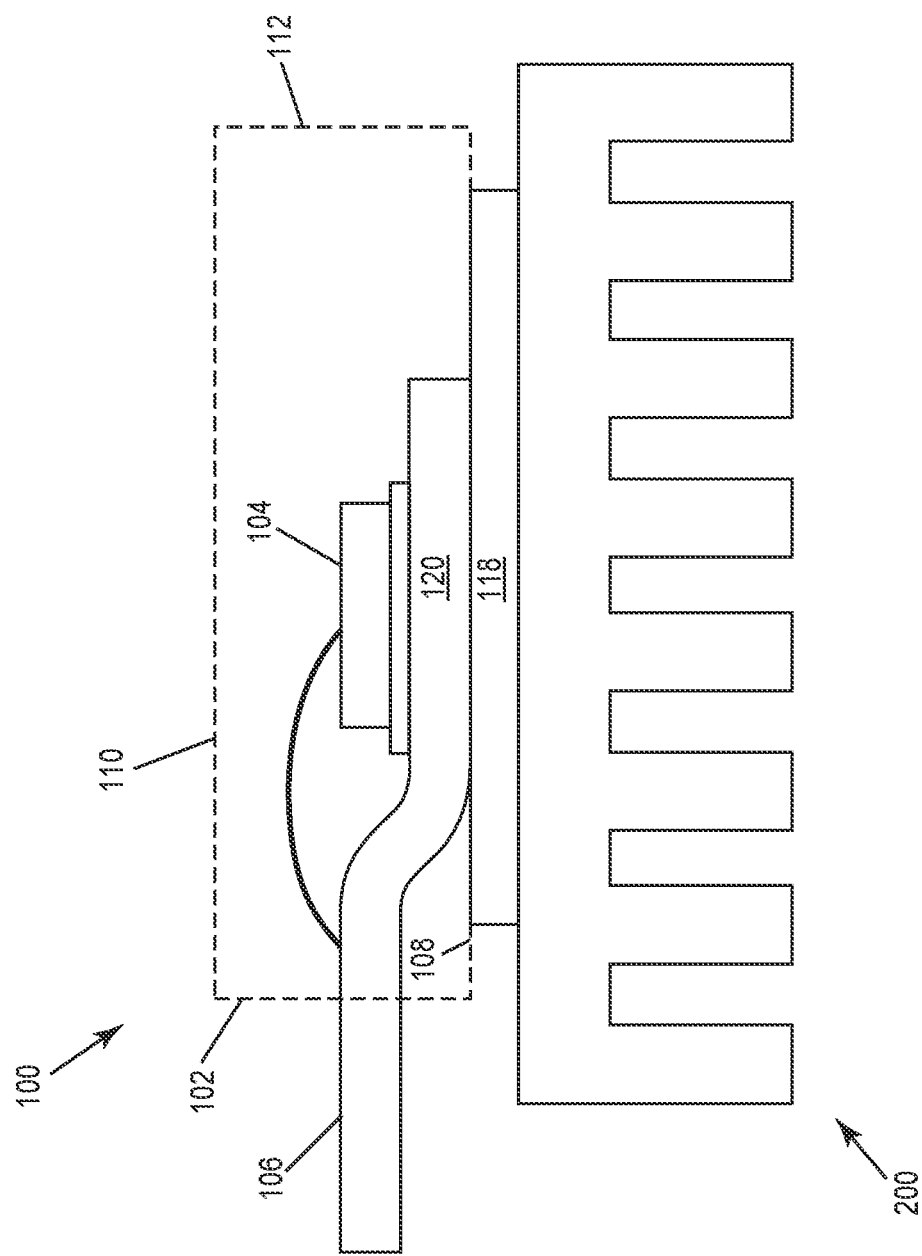
FIG. 3 depicts an assembly that comprises a semiconductor package mounted on a heat sink, according to an embodiment.

Referring to FIG. 3, an assembly that comprises the semiconductor package 100 and a heat sink 200 is shown, according to another embodiment. The semiconductor package 100 is substantially similar to the embodiment shown in FIGS. 1-2, with the following exceptions. One difference is that there is no opening 114 provided in the package body 102. In this case, the package body 102 may be configured such that the encapsulant portion 116 is a continuous region of mold compound that covers and protects the semiconductor die 104. This semiconductor package 100 may be secured to the heat sink 200 using a clip structure. A second difference in this assembly is that the first outer face 108 of the encapsulant portion 116 is a completely planar surface, and the isolation structure 118 is disposed on this planar surface. That is, there is no recess in the encapsulant material that accommodates the isolation structure 118. Various embodiments of the semiconductor package 100 and the assembly may incorporate either one of the above-mentioned differences.

Figure 4:
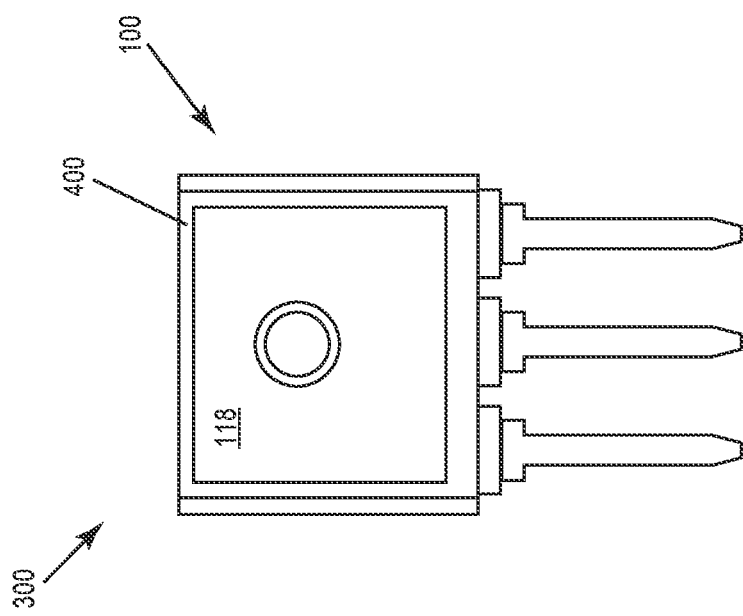
FIG. 4 depicts a semiconductor device that comprises a semiconductor package and a releasable layer, according to an embodiment.

Referring to FIG. 4, a semiconductor device 300 that comprises a releasable layer 400 affixed to the semiconductor package 100 is depicted, according to an embodiment. When the releasable layer 400 is affixed to the semiconductor package 100 and covering the isolation structure 118, it provides a protective sheath that prevents scratching or defacing of the isolation structure 118. Thus, the releasable layer 400 substantially mitigates or eliminates the above-described damage that may occur in the time between the manufacture of the semiconductor package 100 and when the semiconductor package 100 is mounted in an assembly. As shown, the releasable layer 400 completely covers the first surface of the isolation structure 118, and thus completely protects all exposed surfaces of the isolation structure 118. In the case that the semiconductor package 100 comprises the opening 114, the releasable layer 400 may extend over the opening 114 as well. In the case that the isolation structure 118 is disposed within a recess formed within the encapsulant portion 116, the releasable layer 400 may extend past the isolation structure 118 such that the releasable layer 400 may partially cover and be releasable from the first outer face 108 of the encapsulant portion 116. In the case that the isolation structure 118 is disposed outside of the plane of first outer face 108 of the encapsulant portion 116, the releasable layer 400 may exclusively contact the isolation structure 118. More generally, the releasable layer 400 may at least partially cover any exposed surface of an isolation material, thus providing the protective benefit as described herein, and may also contact and be releasable from other adjacent surfaces of the semiconductor package 100

The releasable layer 400 is releasable from the semiconductor package 100. This means that the releasable layer 400 is a temporary element that can be removed from the semiconductor package 100 by mechanical force, e.g., human hand manipulation or robotic motion, that is non-destructive to all elements of the semiconductor package 100 including the isolation structure 118. The releasable layer 400 may be a relatively thin film (e.g., between 0.1-0.01 mm thick) that is adhesively bonded to the semiconductor package 100. The strength of the adhesive that secures the releasable layer 400 to the semiconductor package 100 is selected such that the releasable layer 400 can be removed, e.g., by peeling, without substantially damaging or altering the isolation structure 118. In this way, the releasable layer 400 can be applied to the semiconductor package 100 once manufacture is complete and easily removed by a downstream user, e.g., by removing the releasable layer 400 immediately before mounting the semiconductor package 100.

According to one embodiment, the releasable layer 400 comprises an adhesive tape. For example, the releasable layer 400 can comprise a non-conductive adhesive tape, e.g., a tape comprising polymer, rubber, silicone, etc. with a thickness between 0.1-0.01 mm. This adhesive tape can be adhered to the semiconductor package 100 in a commonly known manner by applying the adhesive side of the adhesive tape to the first outer face 108 of the package body 102.

According to another embodiment, the releasable is layer a non-adhesive film. For example, the releasable layer 400 can be film of non-conductive material comprising polymer, rubber, silicone with a thickness between 0.1 mm and 0.01 mm. This film can be secured to the package by separately applying an electrically insulating adhesive such as an epoxy-based or silicone-based adhesive to the first outer face 108 of the package body 102 and subsequently attaching the film to the electrically insulating adhesive.

Figure 5:
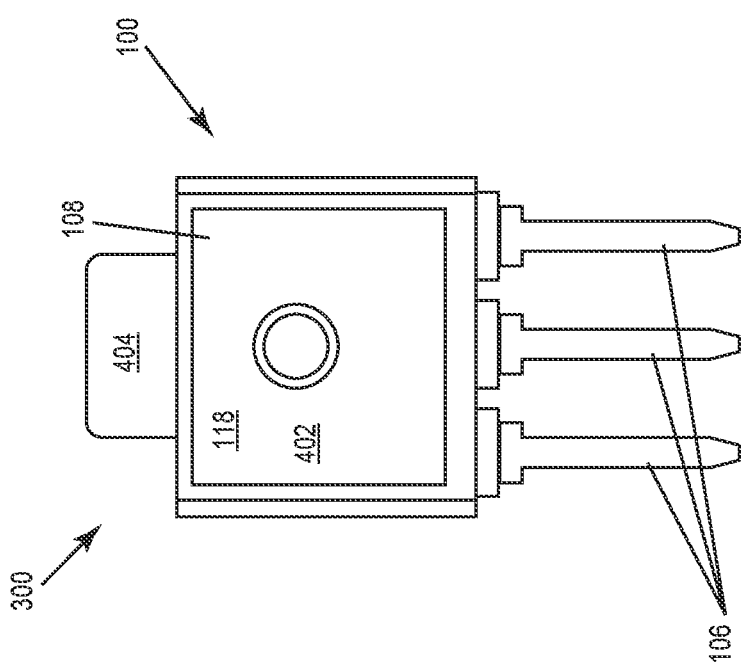
FIG. 5 depicts a semiconductor device that comprises a semiconductor package and a releasable layer, according to another embodiment.

Referring to FIG. 5, a semiconductor device 300 that comprises a releasable layer 400 affixed to the semiconductor package 100 is depicted, according to another embodiment. In this embodiment, the releasable layer 400 comprises a main portion 402 and a tab 404. The main portion 402 is adhered to and releasable from a portion of the first outer face 108 of the package body 102 that comprises the first surface of the isolation structure 118. Thus, the main portion 402 protects the isolation structure 118 in a similar manner as previously described. The tab 404 is connected to the main portion 402 and is decoupled from the package body 102. That is, the tab 404 is not adhered to any surface of the package body 102. As a result, the tab 404 provides a handle that can be grasped, e.g., by a human hand or robotic hand. The tab 404 therefore allows for easy releasing (e.g., peeling) of the releasable layer 400 by providing a surface from which to grip the releasable layer 400. As shown, the tab 404 extends away from the package body 102 in an opposite direction as the leads 106.

Figure 6:
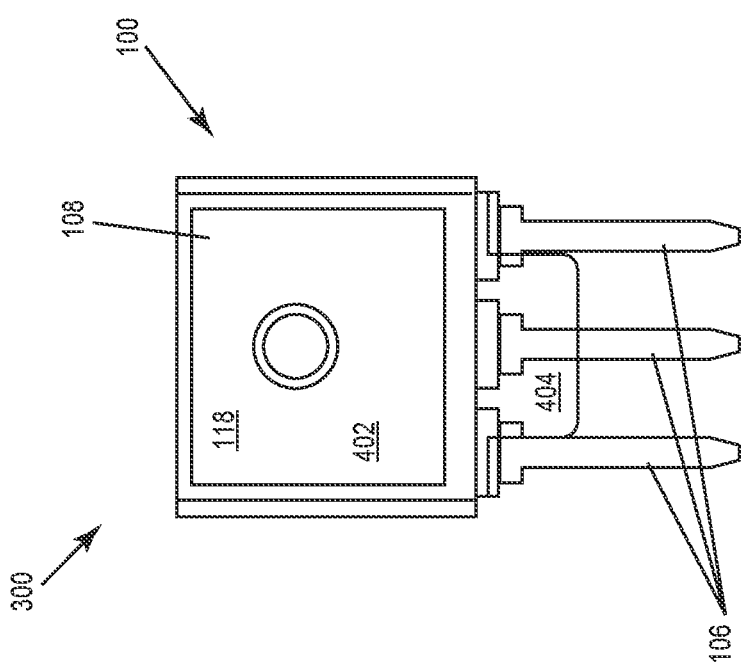
FIG. 6 depicts a semiconductor device that comprises a semiconductor package and a releasable layer, according to another embodiment.

Referring to FIG. 6, a semiconductor device 300 that comprises a releasable layer 400 affixed to the semiconductor package 100 is depicted, according to another embodiment. The embodiment of FIG. 5 is substantially identical to that of FIG. 4, except that the orientation of the releasable layer 400 is reversed such that the tab 404 extends away from the package body 102 in the same direction as the leads 106. This represents one other potential arrangement for a releasable layer 400 that comprises a tab 404. More generally, the orientation, number, and geometry of the tab 404 (or tabs) may vary from the specific embodiments shown in FIGS. 4 and 5. For example, the tab 404 may have any desired shape, and may be designed to be compatible with a particular apparatus for removing the releasable layer 400. Additionally or alternatively, the releasable layer 400 may have multiple tabs 404, e.g., for purposes of redundancy.

Figure 7:
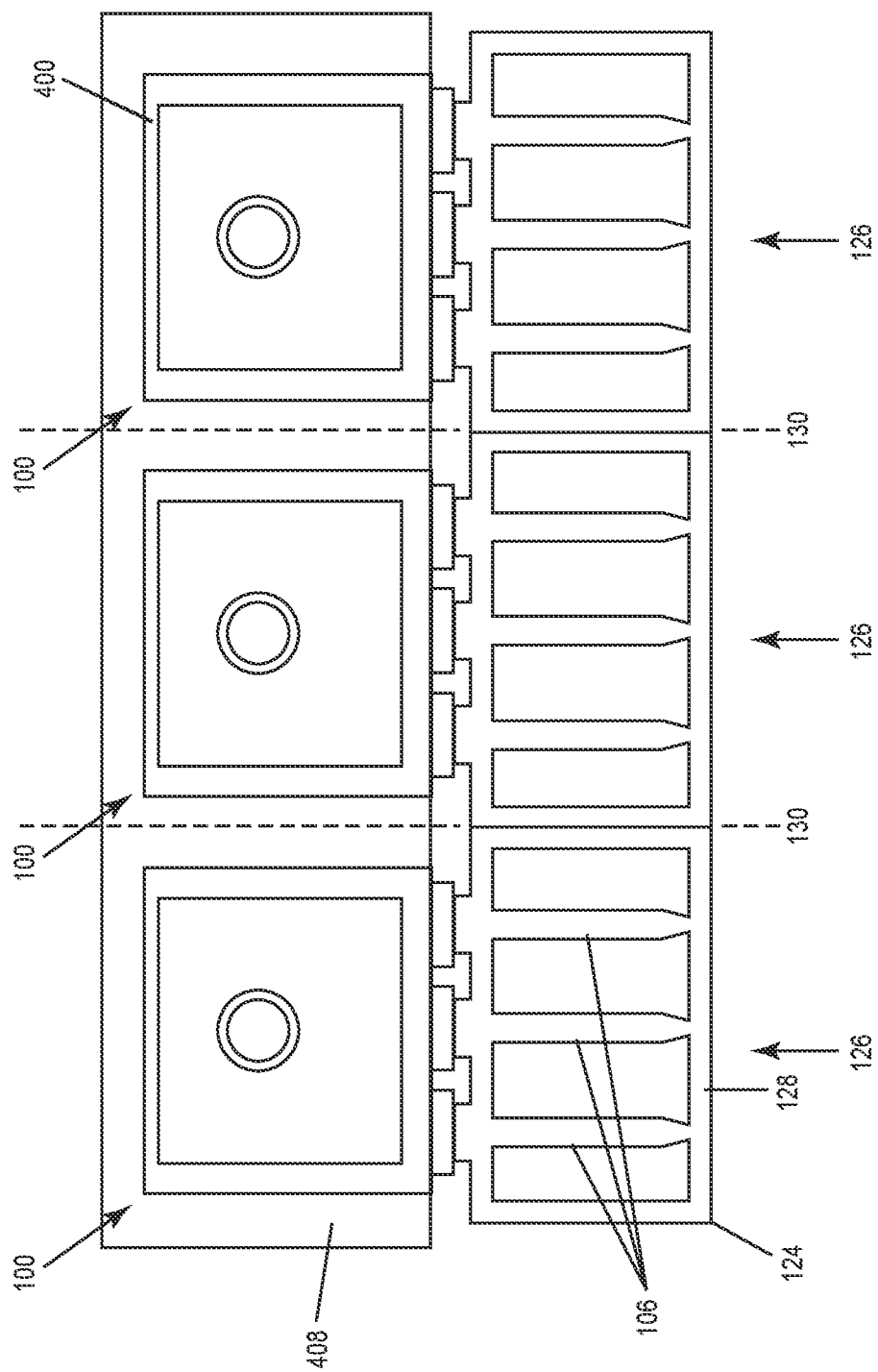
FIG. 7 depicts a lead frame strip that comprises multiple semiconductor packages and a continuous layer of releasable material attached to each package body on the lead frame strip.

Referring to FIG. 7, an assembly for forming the semiconductor package 100 is shown. The assembly comprises a lead frame strip 124 that comprises a plurality of unit lead frames 126. Each of the unit lead frames 126 comprises a die pad 120 (e.g., as shown in FIG. 2) and a plurality of leads 106, thereby providing the lead frame configuration of the semiconductor package 100 as previously described with reference to FIG. 1. The assembly shown in FIG. 6 corresponds to an intermediate phase of manufacture before the leads 106 are detached from a peripheral structure 128 of the lead frame strip 124.

In the assembly of FIG. 7, a continuous layer 408 of releasable material is applied to the first outer face 108 of each package body 102. That is, one strip of material is used to provide the releasable layer 400 for each semiconductor package 100. The continuous layer 408 can be a layer of an adhesive tape, e.g., as previously described. Alternatively, the continuous layer 408 can be a non-adhesive film that is bonded to the semiconductor package 100 by a separate adhesive, e.g., as previously described.

Referring to FIG. 8, a process flow for a method of producing a semiconductor device 300 comprising the semiconductor package 100 is depicted, according to an embodiment.

In a first process step 500, the semiconductor dies 104 are attached to the die pads 120 for each of the unit lead frames 126. This may be done by soldering, for example.

In a second process step 502, a wire bonding process is performed to form the bond wires for each of the unit lead frames 126.

In a third process step 504, a molding process is performed. The molding process forms the encapsulant portion 116 of the package body 102, e.g., by a transfer molding technique.

In a fourth processing step 506, a post mold cure is performed so as to harden the encapsulant portion 116 of the package body 102.

In a fifth process step 508, a second molding process is performed. The second molding process forms the isolation portion of the package body 102, e.g., by a compression molding technique.

In a sixth processing step 510, a post mold cure if performed so as to harden the isolation portion of the package body 102.

In a seventh process step 512, a deflashing step is performed. The deflashing step removes mold flashes, i.e., excess portions or strands of mold material, from the package body 102. The deflashing may be done using a chemical solvent, for example.

In an eighth process step 514, an adhesive layer masking step is performed. The adhesive layer masking step applies a continuous layer 408 of releasable material to the first outer face 108 of each package body 102, e.g., in the manner depicted in FIG. 6.

In a ninth process step 516, the adhesive layer is cured to the semiconductor package 100. This curing may involve the application of ultraviolet light, for example.

In a tenth process step 518, a plating process is performed. The plating process forms a metal plating (e.g., Ag, Cu, Ni, etc.) on the exposed metal leads 106 of each semiconductor package 100. The plating process may comprise an electroplating process or an electroless plating technique, for example.

In an eleventh process step 520, an adhesive layer cutting step is performed. The adhesive layer cuts the continuous layer 408 of releasable material to form the releasable layer 400 for each of the semiconductor packages 100. This may be done by cutting the continuous layer 408 along a separation line 130, e.g., as shown in FIG. 6.

In a twelfth process step 522, a package singulation step is performed. The package singulation step separates each semiconductor package 100 from the lead frame strip 124, e.g., by cutting the leads 106 so as to detach them from the peripheral structure 128. Advantageously, the releasable layer 400 is present on the isolation structure 118 during this step such that the package singulation step does not scratch the isolation structure.

In a thirteenth process step 524, the semiconductor package 100 is tested. For example, the electrical functionality of the semiconductor package 100 and/or the electrical isolation of the isolation structure 118 may be tested by test equipment. Advantageously, the releasable layer 400 is present on the isolation structure 118 during this step such that the testing step does not scratch the isolation structure.

In a fourteenth process step 526, the semiconductor package 100 is arranged in packaging for transport, e.g., by arranging the semiconductor package 100 in plastic, cardboard, Styrofoam, etc. Advantageously, the releasable layer 400 is present on the isolation structure 118 during this step such that the packaging step does not scratch the isolation structure.

The semiconductor package 100 disclosed herein illustrates just one example of a semiconductor package that includes an advanced isolation material thermally coupled to a semiconductor die. The releasable layer 400 described herein is more generally applicable to any type of semiconductor package that comprises a region of isolation material that is softer and more susceptible to scratching or other types of damage than conventional encapsulant material.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a semiconductor package, comprising a package body that comprises an encapsulant portion and an isolation structure, a semiconductor die embedded within the package body, and a plurality of leads that protrude out from the encapsulant body, wherein the encapsulant portion and the isolation structure are each electrically insulating structures, wherein the isolation structure has a greater thermal conductivity than that of the encapsulant portion, and wherein the isolation structure is thermally coupled to the semiconductor die; and
   a releasable layer affixed to the semiconductor package;
   wherein a first outer face of the package body comprises a first surface of the isolation structure,
   wherein the releasable layer at least partially covers the first surface of the isolation structure, and
   wherein the releasable layer is releasable from the semiconductor package.

2. The semiconductor device of claim 1, wherein the encapsulant portion has a greater hardness than that of the isolation structure.

3. The semiconductor device of claim 2, wherein the encapsulant portion comprises a mold compound, and wherein the isolation structure comprises thermal interface material.

4. The semiconductor device of claim 1, wherein the releasable layer completely covers and is releasable from the first surface of the isolation structure.

5. The semiconductor device of claim 3, wherein the first outer face of the package body further comprises a first surface of the encapsulant portion that surrounds the isolation structure, and wherein the releasable layer at least partially covers and is releasable from the first surface of the encapsulant portion.

6. The semiconductor device of claim 3, further comprising an opening in the package body that extends through the isolation structure and the encapsulant portion, and wherein the releasable layer extends over the opening.

7. The semiconductor device of claim 1, wherein the releasable layer is an adhesive tape that is adhered to and releasable from the first surface of the isolation structure.

8. The semiconductor device of claim 1, wherein the releasable layer comprises a main portion and a tab, wherein the main portion is adhered to and releasable from the first surface of the isolation structure, and wherein the tab is connected to the main portion and is decoupled from the package body.

9. The semiconductor device of claim 8, wherein the tab extends away from the package body in an opposite direction as the plurality of leads.

10. The semiconductor device of claim 8, wherein the tab extends away from the package body in the same direction as the plurality of leads.

11. The semiconductor device of claim 1, wherein the semiconductor package further comprises a die pad, wherein the semiconductor die is mounted on the die pad, and wherein the isolation structure is thermally coupled to the semiconductor die via the die pad.

* * * * *